United States Patent
Lin

(10) Patent No.: US 8,836,000 B1
(45) Date of Patent: Sep. 16, 2014

(54) BOTTOM-TYPE PERPENDICULAR MAGNETIC TUNNEL JUNCTION (PMTJ) ELEMENT WITH THERMALLY STABLE AMORPHOUS BLOCKING LAYERS

(71) Applicant: Avalanche Technology, Inc., Fremont, CA (US)

(72) Inventor: Tsann Lin, Saratoga, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/891,833

(22) Filed: May 10, 2013

(51) Int. Cl.
*H01L 29/76* (2006.01)
*H01L 27/22* (2006.01)
*H01L 43/02* (2006.01)

(52) U.S. Cl.
CPC .............. *H01L 43/02* (2013.01); *H01L 27/228* (2013.01)
USPC .................................. 257/295; 257/E29.323

(58) Field of Classification Search
USPC ....... 257/295, 421, 422, 427, E29.323; 438/3
See application file for complete search history.

(56) References Cited

U.S. PATENT DOCUMENTS

2010/0244163 A1\* 9/2010 Daibou et al. ................ 257/421

\* cited by examiner

*Primary Examiner* — Quoc Hoang
(74) *Attorney, Agent, or Firm* — Maryam Imam; Bing K Yen

(57) ABSTRACT

The invention provides a bottom-type perpendicular magnetic tunnel junction (pMTJ) element with thermally stable amorphous blocking layers for high-density nonvolatile data storage. The first blocking layer, preferably formed of an amorphous nonmagnetic film, blocks a polycrystalline diffusion barrier layer with a body-center-cubic (bcc) <110> texture in order for the keeper and lower reference layers of the bottom-type pMTJ element to freely grow with a face-centered-cubic (fcc) <111> texture, thereby developing strong perpendicular magnetic anisotropy (PMA). The second blocking layer, preferably formed of an amorphous ferromagnetic film, blocks the keeper and lower reference layers of the bottom-type pMTJ element in order for the upper reference, barrier and storage layers of the bottom-type pMTJ element to freely grow with a <001> texture, thereby exhibiting a strong tunneling magnetoresistance (TMR) effect.

10 Claims, 3 Drawing Sheets

BOTTOM-TYPE PERPENDICULAR MAGNETIC TUNNEL JUNCTION (PMTJ) ELEMENT WITH THERMALLY STABLE AMORPHOUS BLOCKING LAYERS

FIELD OF THE INVENTION

The invention relates generally to a spin transfer torque magnetic random access memory (STT-MRAM) cell including a magnetic tunnel junction (MTJ) element and particularly to a bottom-type perpendicular MTJ (pMTJ) element with thermally stable amorphous blocking layers for nonvolatile high-density data storage.

BACKGROUND

A spin transfer torque magnetic random access memory (STT-MRAM) device, which includes an array of densely packed STT-MRAM cells, is currently extensively explored for nonvolatile high-density data storage, since it exhibits non-volatility the same as a hard disk drive (HDD), a density as high as a dynamic RAM (DRAM) device, and a speed as fast as a static RAM (SRAM) device. In each STT-MRAM cell, a magnetic tunnel junction (MTJ) element, which mainly includes a nonmagnetic insulating barrier layer sandwiched between a ferromagnetic reference layer and a ferromagnetic storage layer, is integrated with a complementary metal-oxide-semiconductor (CMOS) transistor for write and read operations.

During the write operation of a conventional in-plane MTJ (iMTJ) element used in the STT-MRAM cell with a technology node of >90 nanometer (nm), the magnetization of the reference layer is rigidly pinned by an antiferromagnetic pinning layer in its plane, while the magnetization of the storage layer can be freely switched in its plane by a spin-transfer-torque (STT) into a direction parallel or antiparallel to that of the reference layer. The STT switching occurs when a write current passes through the iMTJ element and causes spin-polarized electrons to transfer a part of its angular momentum to and exert a torque on the magnetization of the storage layer. It is crucial to minimize a critical switching current density ($J_C$) to below $10^5$ amperes per square centimeter (A/cm$^2$) for preventing the barrier layer from dielectric breakdown while maintaining effective STT switching.

During the read operation of a conventional iMTJ element, a read current passes through the iMTJ element and causes electrons to quantum-jump across the barrier layer. Scattering of electrons at lower and upper interfaces of the barrier layer induces a tunneling magnetoresistance (TMR) effect. When the magnetization of the storage layer is switched into a direction parallel to that of the reference layer, scattering is the lowest and the iMTJ element exhibits a minimal resistance ($R_O$). When the magnetization of the storage layer is switched into a direction antiparallel to that of the reference layer, scattering is the highest and the iMTJ element exhibits a maximal resistance ($R_O+\Delta R_T$), where $\Delta R_T$ is the maximum tunnel magnetoresitance. To distinctly separate distributions of the two magnetizations states, coded as "0" and "1", it is crucial to maximize a TMR coefficient ($\Delta R_T/R_O$) beyond 100%.

On the other hand, during the write operation of an advanced perpendicular (pMTJ) element used in the STT-MRAM cell with a technology node of <90 nm, the magnetization of the reference layer is strongly magnetized in a direction perpendicular to its plane, while the magnetization of the storage layer can be freely switched out of its plane by the STT switching into a direction parallel or antiparallel to that of the reference layer. By replacing the iMTJ with pMTJ elements, the STT switching becomes more effective so that $J_C$ can be further minimized and the technology node can be further reduced. To properly perform the write operation with the pMTJ element, its reference and storage layers require specific polycrystalline structures and textures for attaining a high perpendicular magnetic anisotropy (PMA).

The read operation of the pMTJ element is basically identical to that of the iMTJ element. To properly perform the read operation with the pMTJ element, its reference, barrier and storage layers require different specific polycrystalline structures and textures for attaining a high $\Delta R_T/R_O$.

In addition, a buffer layer which is sandwiched between a first interconnect and the pMTJ element has its own polycrystalline structure and texture. Mismatches at interfaces of different polycrystalline structures and textures may cause difficulties in attaining the desired high PMA and $\Delta R_T/R_O$. Furthermore, after annealing at high temperatures, diffusions may occur at interfaces of different polycrystalline structures and textures and thus further deteriorate the PMA and $\Delta R_T/R_O$.

FIG. 1 shows the schematic cross-sectional view of an STT-MRAM cell 100 in accordance with a prior art and the invention. The STT-MRAM cell 100 includes a CMOS transistor 110, a first interconnect 120, a bottom-type perpendicular magnetic tunnel junction (pMTJ) element 130, a second interconnect 140 and an insulator 150. The CMOS transistor 110 includes a p-type semiconductor substrate 112, a source 114, a drain 116, a floating gate 117 and a control gate 118. The first interconnect 120 comprises a lower stud 122, an upper stud 124 formed on top of the lower stud 122, and a diffusion barrier layer 126 formed on top of the upper stud 124. The pMTJ element 130 is formed on top of the diffusion barrier layer 126 and the second interconnect 140 is formed on top of the pMTJ 130. The insulator 150 is formed above the source 114, the drain 116, and the control gate 118, the diffusion barrier layer 126, and the second interconnect 140.

In the prior art, the lower stud 122 is formed of a nonmagnetic tungsten (W) film, the upper stud 124 is formed of a nonmagnetic copper (Cu) film, and the diffusion barrier layer 126 is formed of a nonmagnetic tantalum nitride (TaN$_x$) film. The pMTJ element 130 is electrically connected to the first interconnect 120 and the second interconnect 140, but is electrically insulated by the insulator 150. During the write or read operation of the pMTJ element 130, the insulator 150 confines a write or read current to flow through the first interconnect 120, the pMTJ element 130 and the second interconnect 140 (or vice versa).

It is understood that only one bottom-type pMTJ element 130 is shown in the STT-MRAM cell 100 and discussed herein merely in the interest of brevity, and that numerous such pMTJ elements 130 in the STT-MRAM cell 100 are contemplated.

FIG. 2 shows the schematic cross-sectional view of a bottom-type pMTJ element 130/200 in accordance with the prior art. The bottom-type pMTJ element 200 typically comprises an electrically insulating barrier layer 240 sandwiched between a lower stack 220 and an upper stack 260. The barrier layer 240 is formed of a 1.2 nm thick nonmagnetic MgO film. When the read current quantum jumps across the barrier layer 240, changes in the electrical resistance are detected due to a tunneling magnetoresistance (TMR) effect.

The lower stack 220 comprises a buffer layer 222 formed of a 4 nm thick nonmagnetic Ta film, a seed layer 224 formed of a 4 nm thick nonmagnetic Pd film, a keeper layer 226 formed of [Co(0.2)/Pd(0.8)]×8/Co(0.4) (thickness in nm) films, a spacer layer 228 formed of a 0.8 nm thick nonmagnetic Ru film, a lower reference layer 230 formed of ferromagnetic Co(0.4)/Pd(0.8)/[Co(0.2)/Pd(0.8)]×2 films, and an upper reference layer 232 formed of a 0.8 nm thick ferromagnetic 60Fe-20Co-20B (composition in atomic percent) film.

The upper stack 260 comprises a storage layer 262, a lower cap layer 264, and an upper cap layer 266. The storage layer 262 is formed of a 1.2 nm thick ferromagnetic 60Fe-20Co-20B film, the lower cap layer 264 is formed of a 1.2 nm thick nonmagnetic MgO film, and the upper cap layer 266 is formed of a 80 nm thick nonmagnetic Ta film.

In the fabrication process of the STT-MRAM cell 100, the bottom-type pMTJ element 200 is deposited on a wafer onto which the CMOS transistor 110 and the first interconnect 120 is previously formed. The wafer is then annealed with a magnetic field of 10,000 Oe for 2 hours at 320° C. in a direction perpendicular to the wafer in a high-vacuum oven. The bottom-type pMTJ element 200 is then patterned in a photolithographic process to produce a feature size. After protecting the bottom-type pMTJ element 200 with insulation layers 150 and opening a via, the second interconnect 140 is deposited. The fabrication process then continues for multi-level interconnections and packaging.

To properly perform the write operation with the bottom-type pMTJ element 220, the magnetizations of the keeper layer 226, the lower reference layer 230, the upper reference layer 232 and the storage layer 262 must exhibit strong PMA. To exhibit strong PMA, the Co/Pd multilayer films used as the keeper layer 226 and the lower reference layer 230 must exhibit an fcc <111> texture, while the Fe—Co—B films used as the upper reference layer 232 and the storage layer 262 must be ultrathin and contact with the MgO film used as the barrier layer 240.

To properly perform the read operation with the bottom-type pMTJ element 220, a high $\Delta R_T/R_O$ is needed. To exhibit the high $\Delta R_T/R_O$, an amorphous structure in the Fe—Co—B film used as the upper reference layer 232 must be transformed into a bcc structure with a <001> texture during annealing, which facilitates the barrier layer 240 and the storage layer 262 to also develop <001> textures and thus establish a Co—Fe—B<001>/MgO<001>/Co—Fe—B<001> epitaxial relationship needed for coherent tunneling. Due to a mismatch between the fcc <111> texture needed for the Co/Pd multilayer films and the bcc <001> texture needed for the Co—Fe—B film, the $\Delta R_T/R_O$ is still not high enough to properly perform the read operation.

It should be noted that the first interconnect 120 comprises a diffusion barrier layer 126 formed of a 8 nm thick $TaN_x$ film used to prevent an underlying Cu stud 124 from diffusions. This diffusion barrier layer 126 may cause the overlying Ta buffer layer 222 to develop a bcc <110> texture. Due to a mismatch between the bcc <110> texture developed in the Ta buffer layer 222 and the fcc <111> texture needed for the Pd seed layer 224 and the Co/Pd multilayer films, the keeper layer 226 and the lower reference layer 230 may not exhibit the fcc <111> texture strong enough to develop the needed PMA. Accordingly, there is a need of eliminating the mismatches and diffusions at interfaces of different polycrystalline structures and textures in order for the pMTJ element to exhibit the desired high PMA and $\Delta R_T/R_O$.

Accordingly, a bottom-type perpendicular MTJ (pMTJ) element with thermally stable amorphous blocking layers, which eliminate the mismatches and diffusions at interfaces of different polycrystalline structures and textures is needed.

SUMMARY OF THE INVENTION

Briefly, an embodiment of the invention provides a bottom-type perpendicular magnetic tunnel junction (pMTJ) element with thermally stable amorphous blocking layers for high-density nonvolatile data storage. The first blocking layer, preferably formed of an amorphous nonmagnetic film, blocks a polycrystalline diffusion barrier layer with a body-center-cubic (bcc)<110> texture in order for the keeper and lower reference layers of the bottom-type pMTJ element to freely grow with a face-centered-cubic (fcc)<111> texture, thereby developing strong perpendicular magnetic anisotropy (PMA). The second blocking layer, preferably formed of an amorphous ferromagnetic film, blocks the keeper and lower reference layers of the bottom-type pMTJ element in order for the upper reference, barrier and storage layers of the bottom-type pMTJ element to freely grow with a <001> texture, thereby exhibiting a strong tunneling magnetoresistance (TMR) effect.

DETAILED DESCRIPTION OF VARIOUS EMBODIMENTS OF THE INVENTION

Figure 1:
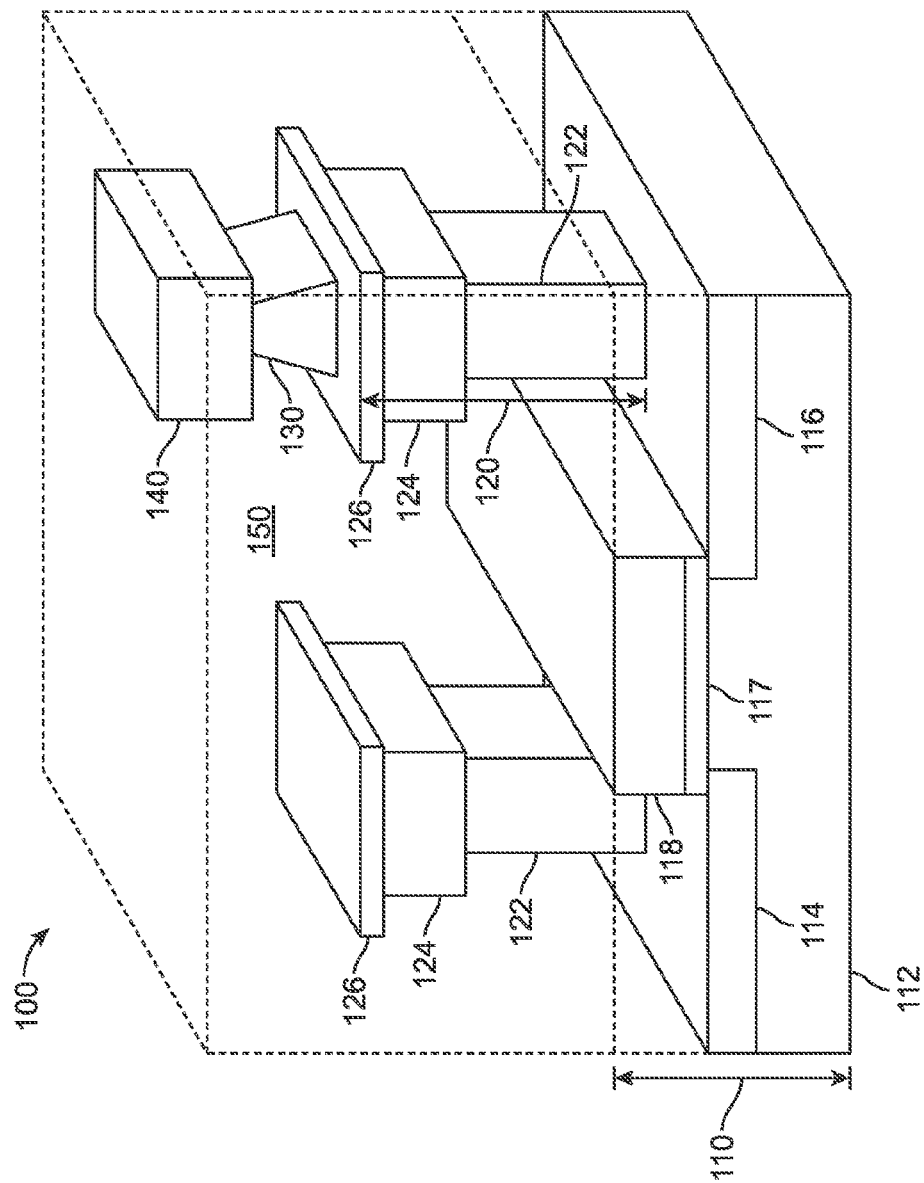
FIG. 1 is the schematic cross-sectional view of an MRAM cell including a CMOS transistor and a pMTJ element in accordance in accordance with prior art techniques.
Figure 2:
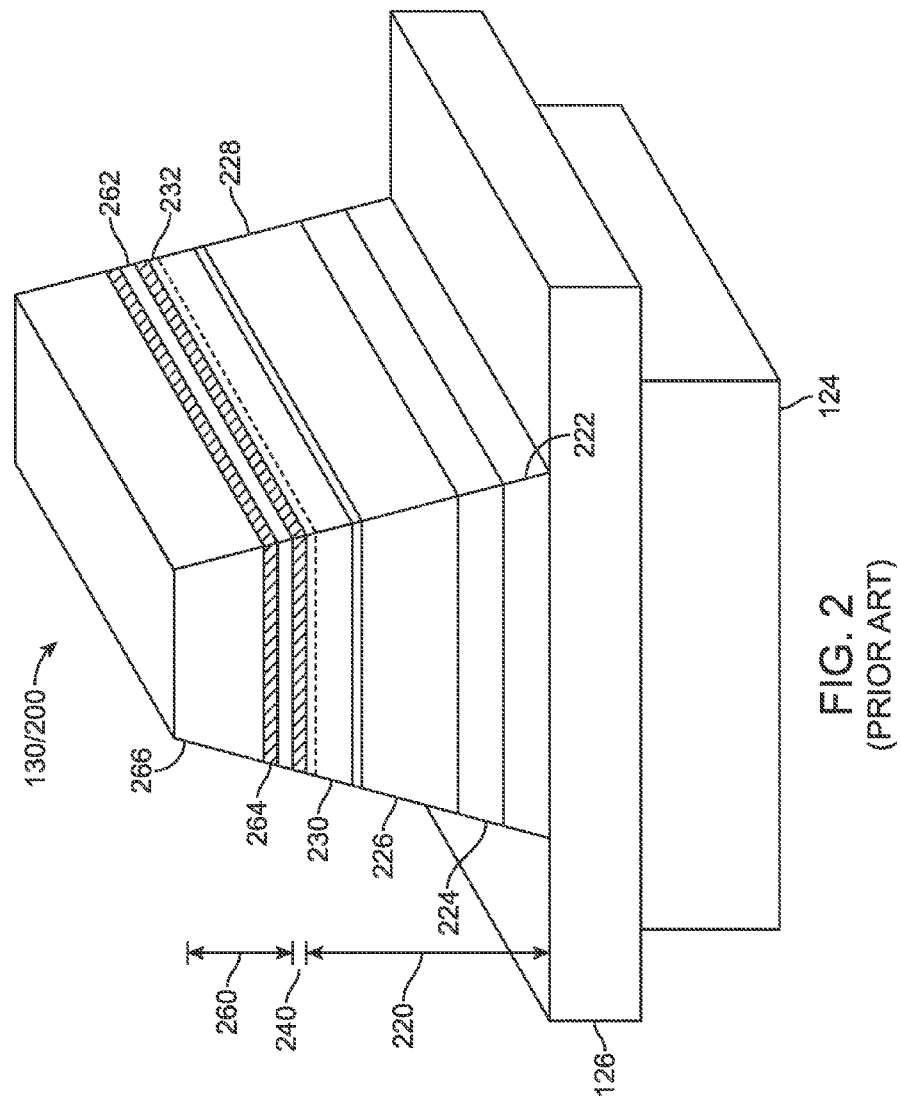
FIG. 2 is the schematic cross-sectional view of a bottom-type pMTJ element in accordance with prior art techniques.
Figure 3:
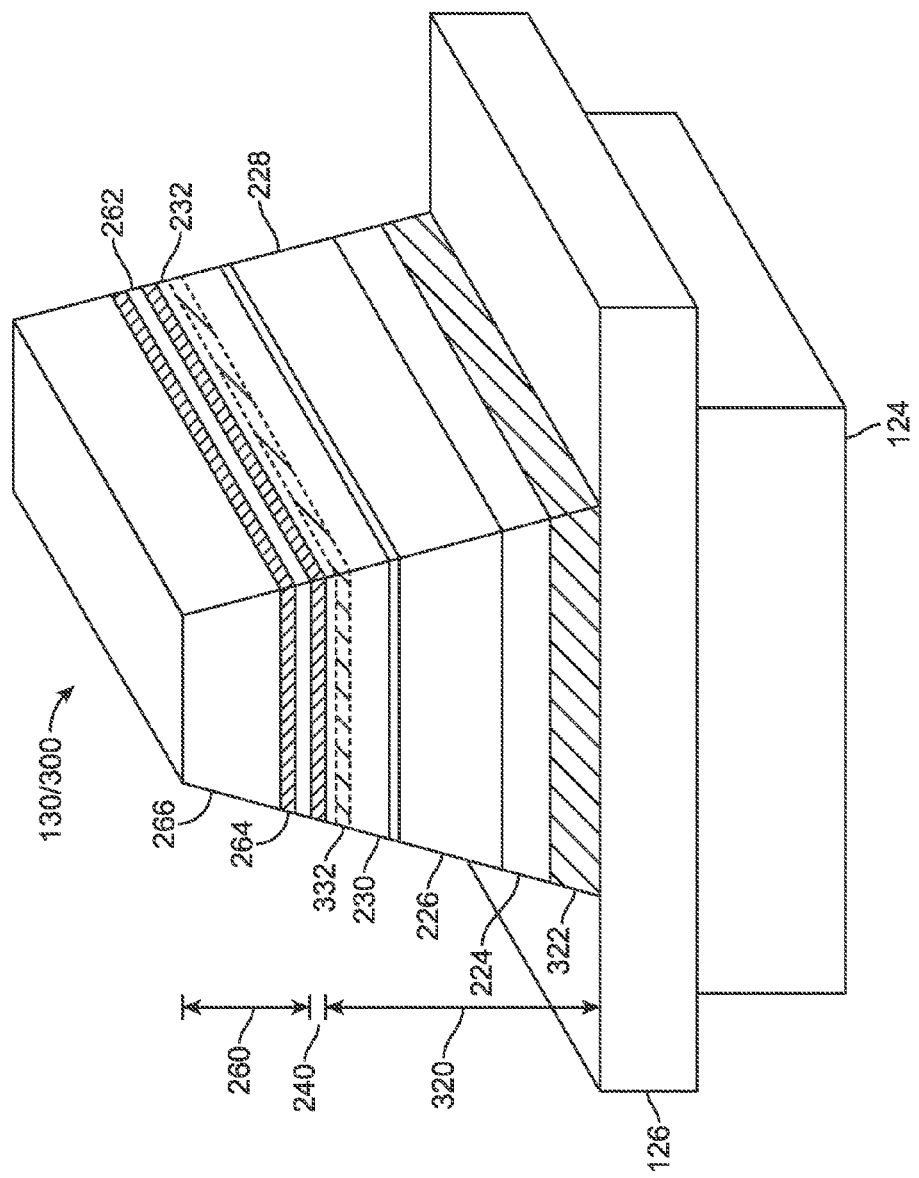
FIG. 3 is the schematic cross-sectional view of a bottom pMTJ element in accordance with an embodiment of the invention.

FIG. 3 shows a bottom-type pMTJ element 130/300 in accordance with an embodiment of the invention. The bottom-type pMTJ element 300 is basically identical to the bottom-type pMTJ element 200 except that a first blocking layer 322 is used to replace the Ta buffer layer 222, and a second blocking layer 332 is inserted between the lower reference layer 230 and the upper reference layer 232. In other words, the lower stack 320 in accordance with the invention comprises the first blocking layer 322, the seed layer 224, the keeper layer 226, the spacer layer 228, the lower reference layer 230, the second blocking layer 332 and the upper reference layer 232.

The first blocking layer 322 is preferably formed of an amorphous nonmagnetic film containing at least two chemical elements with substantially different atomic radii. The first chemical element may be selected from one of a first group including Ni, Co, Fe, Cr and Ti with atomic radii of 0.149, 0.152, 0.156, 0.166 and 0.176 nm, respectively. The second chemical element may be selected from one of a second group including Nb, Zr, Hf and Y with atomic radii of 0.198, 0.206, 0.208 and 0.212 nm, respectively. The second chemical element may have a content of at least 12 at % (in atomic percent) to occupy substitute sites of a crystalline structure formed by the first chemical element, thereby distorting the crystalline structure and forming a substitute-type amorphous structure. This content may optionally further increase to at least 24 at % to eliminate magnetic moments of the Ni, Co or Fe which is preferably selected to ensure the formation of the amorphous structure due to its smaller atomic radius. This substitute-type amorphous structure in general has a crystallization temperature of more than 400° C., so that the first blocking layer 322 can fully block the first interconnect 120 and effectively prevent its microstructural effects on the bottom-type pMTJ element 300. As a result, on the substitute-type amorphous structure, the seed layer 224, the keeper layer 226, and the lower reference layer 230 can freely develop their own fcc <111> texture, thereby attaining the desired high PMA. The second blocking layer 332 is preferably formed of an amorphous ferromagnetic film containing at least three chemical elements with substantially different atomic radii. The first chemical element may be selected from one of a first group containing Ni, Co, Fe, Cr and Ti. The second chemical element may be selected from one of a second group containing Nb, Zr, Hf and Y. The third chemical element may be selected from one of a third group containing O, N, C and B with atomic radii of 0.048, 0.056, 0.067 and 0.087 nm, respectively. The second chemical element may have a content of at most 12 at % to occupy substitute sites of a crystalline structure formed by the first chemical element, thereby distorting the crystalline structure and forming a substitute-type amorphous structure. The third chemical element may have a content of at most 20 at % to occupy interstitial sites of a crystalline structure formed by the first chemical element, thereby also distorting the crystalline structure and forming an interstitial-type amorphous structure. Both the contents should not be too high in order to still maintain residual magnetic moment for ferromagnetic continuity between the lower reference layer 230 and the upper reference layer 232. This hybrid-type amorphous structure in general has a crystallization temperature of more than 400° C., so that the second blocking layer 332 can fully block the lower reference layer 230, and effectively prevent effects of the fcc <111> texture freely developed in the seed layer 224, the keeper layer 226, and the lower reference layer 230 on the upper reference layer 232, the barrier layer 240 and the storage layer 262. As a result, on the hybrid-type amorphous ferromagnetic structure, the upper reference layer 232, the barrier layer 240 and the storage layer 262 can freely develop their own <001> epitaxial relationship, thereby attaining the desired high $\Delta R_T/R_O$. Although various aspects of the invention have been described in terms of a specific embodiment, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A bottom-type perpendicular magnetic tunnel junction (pMTJ) element comprising:
    a barrier layer sandwiched between a lower stack and an upper stack;
    the lower stack comprising:
        a first blocking layer;
        a seed layer on the first blocking layer;
        a keeper layer on the seed layer;
        a spacer layer on the keeper layer;
        a lower reference layer on the spacer layer;
        a second blocking layer on the lower reference layer; and
        an upper reference layer on the second blocking layer;
    the upper stack comprising:
        a storage layer on the barrier layer;
        a lower cap layer on the storage layer; and
        an upper cap layer on the lower cap layer.

2. The bottom-type pMTJ element as in claim 1, wherein the first blocking layer is amorphous and has a thickness ranging from 0.8 to 80 nm.

3. The bottom-type pMTJ element as in claim 1, wherein the first blocking layer contains at least two chemical elements, the first being selected from one of a first group including Ni, Co, Fe, Cr and Ti with a content ranging 70 to 94 at %, and the second being selected from one of a second group including Nb, Zr, Hf and Y with a content ranging from 6 to 30 at %.

4. The bottom-type pMTJ element as in claim 1, wherein the second blocking layer is amorphous ferromagnetic and has a thickness ranging from 0.4 to 20 nm.

5. The bottom-type pMTJ element as in claim 1, wherein the second blocking layer contains at least three chemical elements, the first being selected from one of a first group including Ni, Co, Fe, Cr and Ti with a content ranging 42 to 84 at %, the second being selected from one of a second group including Nb, Zr, Hf and Y with a content ranging from 8 to 24 at %, and the third being selected from one of a third group including O, N, C and B with a content ranging from 8 to 24 at %.

6. A spin transfer torque magnetic random access memory (STT-MRAM) cell including
    a complementary metal-oxide-semiconductor (CMOS) transistor;
    a first interconnect;
    a bottom-type perpendicular magnetic tunnel junction (pMTJ) element comprising
        a barrier layer sandwiched between a lower stack and an upper stack;
        the lower stack comprising:
            a first blocking layer;
            a seed layer on the first blocking layer;
            a keeper layer on the seed layer;
            a spacer layer on the keeper layer;
            a lower reference layer on the spacer layer;
            a second blocking layer on the lower reference layer; and
            an upper reference layer on the second blocking layer;
        the upper stack comprising:
            a storage layer on the barrier layer;
            a lower cap layer on the storage layer; and
            an upper cap layer on the lower cap layer;
    a second interconnect; and
    an insulator.

7. The STT-MRAM cell as in claim 6, wherein the first blocking layer is amorphous and has a thickness ranging from 0.8 to 80 nm.

8. The STT-MRAM cell as in claim 6, wherein the first blocking layer contains at least two chemical elements, the first being selected from one of a first group including Ni, Co, Fe, Cr and Ti with a content ranging 70 to 94 at %, and the second being selected from one of a second group including Nb, Zr, Hf and Y with a content ranging from 6 to 30 at %.

9. The STT-MRAM cell as in claim 6, wherein the second blocking layer is amorphous ferromagnetic and has a thickness ranging from 0.4 to 20 nm.

10. The STT-MRAM cell as in claim 6, wherein the second blocking layer contains at least three chemical elements, the first being selected from one of a first group including Ni, Co, Fe, Cr and Ti with a content ranging 42 to 84 at %, the second being selected from one of a second group including Nb, Zr, Hf and Y with a content ranging from 8 to 24 at %, and the third being selected from one of a third group including O, N, C and B with a content ranging from 8 to 24 at %.

* * * * *